United States Patent
Mok et al.

(10) Patent No.: US 7,134,484 B2
(45) Date of Patent: Nov. 14, 2006

(54) INCREASED EFFICIENCY IN LIQUID AND GASEOUS PLANAR DEVICE COOLING TECHNOLOGY

(75) Inventors: Lawrence Shungwei Mok, Brewster, NY (US); Tsorng-Dih Yuan, Hopewell Jct., NY (US)

(73) Assignee: International Business Machines Corporation, Armonk, NY (US)

( * ) Notice: Subject to any disclaimer, the term of this patent is extended or adjusted under 35 U.S.C. 154(b) by 364 days.

(21) Appl. No.: 09/732,117

(22) Filed: Dec. 7, 2000

(65) Prior Publication Data

US 2002/0070006 A1  Jun. 13, 2002

(51) Int. Cl.
*H05K 7/20* (2006.01)
*F28F 3/12* (2006.01)

(52) U.S. Cl. ............... 165/80.4; 165/168; 165/170; 257/714; 361/699

(58) Field of Classification Search ............... 165/80.4, 165/168, 170; 361/699, 698, 697; 257/714
See application file for complete search history.

(56) References Cited

U.S. PATENT DOCUMENTS

| | | | | |
|---|---|---|---|---|
| 3,327,776 A | * | 6/1967 | Butt | 165/170 |
| 4,072,188 A | * | 2/1978 | Wilson et al. | 165/80.4 |
| 4,085,728 A | * | 4/1978 | Tomchak | 165/170 |
| 4,513,812 A | * | 4/1985 | Papst et al. | 361/697 |
| 4,612,978 A | * | 9/1986 | Cutchaw | 257/714 |
| 4,712,158 A | * | 12/1987 | Kikuchi et al. | 361/699 |
| 4,720,981 A | * | 1/1988 | Helt et al. | 165/80.4 |
| 4,884,168 A | * | 11/1989 | August et al. | 165/80.4 |
| 5,111,280 A | * | 5/1992 | Iversen | 165/80.4 |
| 5,179,500 A | * | 1/1993 | Koubek et al. | 361/700 |
| 5,239,200 A | * | 8/1993 | Messina et al. | 165/80.4 |
| 5,285,347 A | | 2/1994 | Fox et al. | 361/699 |
| 5,370,178 A | | 12/1994 | Agonafer et al. | |
| 5,394,936 A | * | 3/1995 | Budelman | 257/714 |
| 5,522,452 A | | 6/1996 | Mizuno et al. | |
| 5,731,954 A | * | 3/1998 | Cheon | 257/714 |
| 5,763,951 A | * | 6/1998 | Hamilton et al. | 257/714 |

* cited by examiner

*Primary Examiner*—Leonard R. Leo
(74) *Attorney, Agent, or Firm*—Thomas A. Beck; Daniel P. Morris

(57) ABSTRACT

A two loop heat conversion system for high heat density planar devices in which high density heat in an area adjacent to a surface is transferred into a liquid cooling medium closed loop in a radiated heat to liquid heat transfer component positioned in contact with the surface that is connected, to a liquid to gas medium, heat exchanger in a first loop and a gas medium second loop is arranged to carry away all radiated heat from the assembly and all heat extracted from the liquid in the liquid to gas heat exchanger and exhaust it to the ambient. The radiated heat transfer component of the invention provides a transition in manufacturing that is practiced employing the planar type tools in fabrication which usually can neither be practiced manually or observed without substantial magnification.

1 Claim, 3 Drawing Sheets

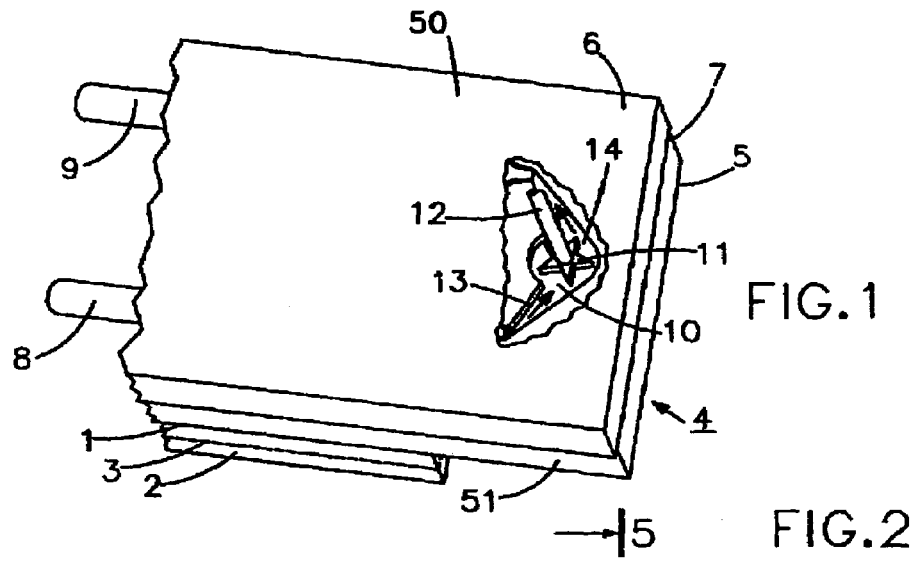
FIG. 1
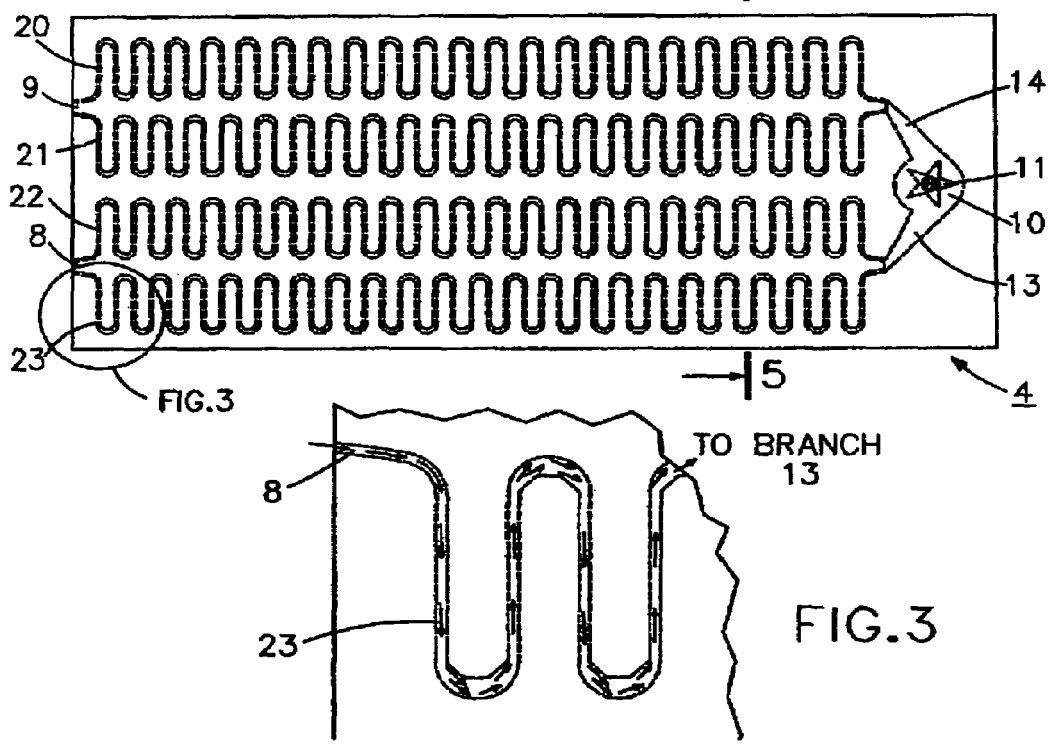
FIG. 2
FIG. 3

INCREASED EFFICIENCY IN LIQUID AND GASEOUS PLANAR DEVICE COOLING TECHNOLOGY

FIELD OF THE INVENTION

The invention is in the field of heat dissipation and in particular to the efficient transfer of heat from a planar area of densely packed point locations through a surface to an external ambient.

BACKGROUND

Structures are being developed in the art wherein temperature control is of importance in a planar layer adjacent to a surface. A highly technically active example being the integrated circuit chip device. Other examples involve structures where there is a layer of a thermally, optically or electrically responsive material beneath a protective cover. Considering the integrated circuit chip as at least an electrically responsive example; as power density increases in such planar structures there is a closely packed area of point sources of heat that must be dissipated through an adjacent surface. In such structures efficiency imitations are being encountered in the transfer of the heat to an external ambient.

At the present state of the art the combined use of liquid and gaseous media is receiving attention in efforts to advance efficiency in heat transfer.

Present developments in the integrated circuit cooling art are directed to the use of air and water which are gaseous and liquid cooling media. However, such systems for the transfer of the heat from the planar source area to the liquid involve large physical space requiring structure.

One illustration in the art appears in U.S. Pat. No. 5,285,347 where a finned heat sink transfer system and a liquid pathway system through the heat sink, are used together.

Another illustration in the art appears in U.S. Pat. No. 5,522,452 where a finned heat sink transfer system operates in a liquid system that includes nozzles spraying fins of the heat sink with liquid.

The systems heretofore in the art require space consuming structure that tends to inhibit progress in the ever increasing need for greater density and in heat transfer efficiency.

SUMMARY OF THE INVENTION

In the invention there is provided a planar, radiation to liquid, through convection and conduction, heat transfer component, positioned in contact with the surface of the structure that transfers the radiated heat through the surface of the structure to a liquid, and a gaseous cooling system that passes over at least the radiation to liquid heat transfer component and through a liquid to gas heat converter that transfers the heat in the liquid in the planar component to the gas and then exausts into an ambient. The radiation to liquid heat transfer component is a planar, surface contacting, assembly of serpentine pathways of liquid that is moved by an appropriately scaled embedded rotating element pump. The gaseous cooling sub system involves gas flow over the planar component and over the other to be cooled portions of the apparatus and through the liquid to gas heat coverter to the ambient.

BRIEF DESCRIPTION OF THE DRAWINGS

FIG. 1 is a perspective view of the planar radiation to liquid heat transfer invention component.

FIG. 2 is an overhead view of the radiation to liquid heat transfer component of the invention illustrating the serpentine repetitive multiple direction change liquid paths and liquid pumping capability.

FIG. 3 is an expanded, along the lines 3—3, view of a typical serpentine liquid passageway in the radiation to liquid heat transfer component of the invention.

FIGS. 6 and 7 are exemplary interdigitating parts that together provide the functions of the radiation to liquid heat transfer component of the invention; in which, FIG. 6 is an inside view of one complementary part of an example radiation to liquid heat transfer component of the invention, and, FIG. 7 is an inside view of the second complementary part of the example radiation to liquid heat transfer component of the invention.

DESCRIPTION OF THE INVENTION

Figure 4:
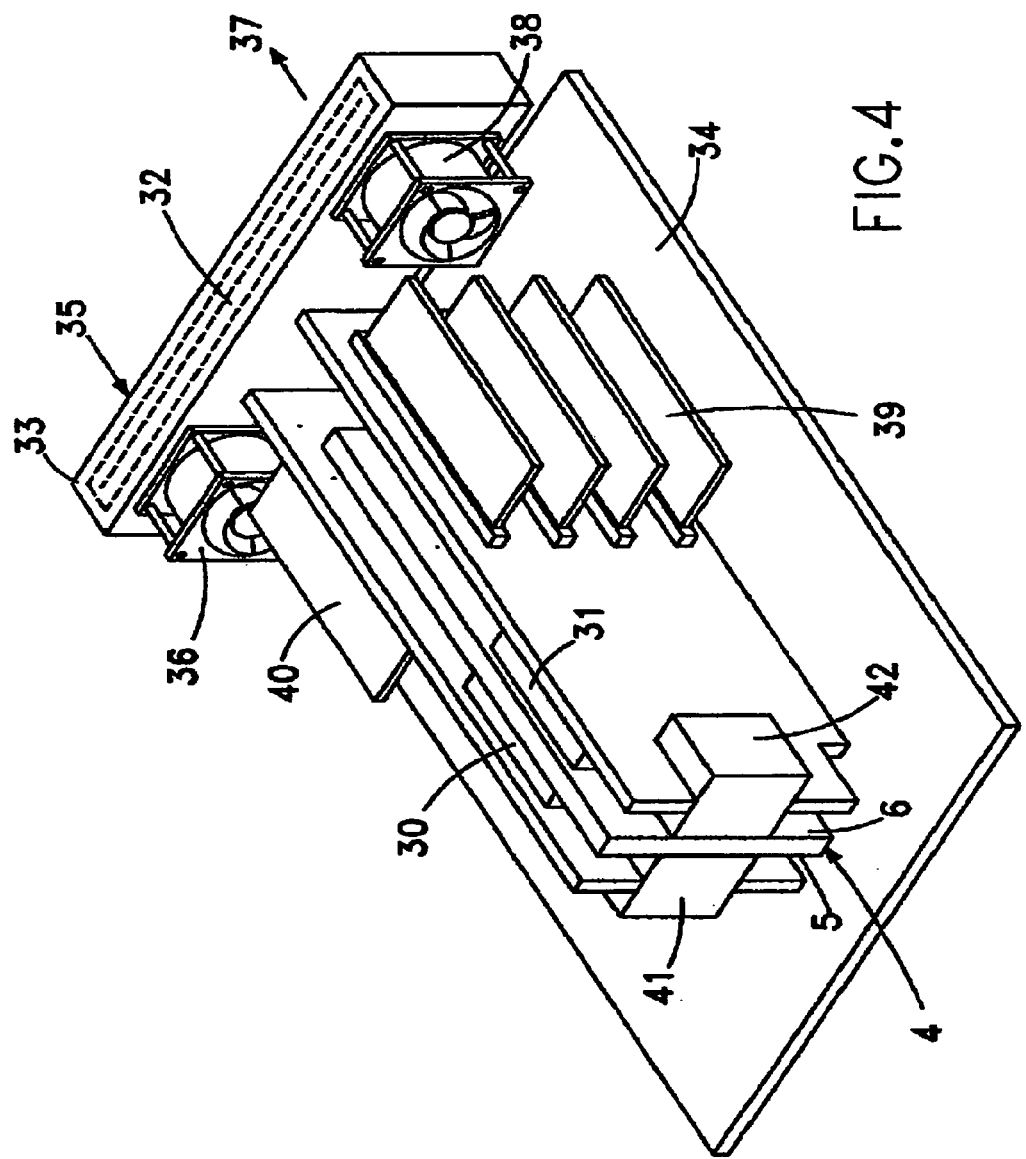
FIG. 4 is an exemplary perspective view of a cooling system for a pair of integrated circuit arrays using liquid and gas cooling simultaneously.

The invention achieves high efficiency transfer of heat passing through a surface of a structure, that is produced by an area of a high density of point sources of heat originating adjacent to the surface by providing a planar shaped, radiation to liquid, heat transfer component, that is positioned in contact with and conforms to the surface of the structure. The component of the invention is produced generally by using the type of planar manufacturing techniques used in the art to produce those high heat densities and thereby be able to approach the types of densities encountered in integrated circuits. The radiation to liquid component, is constructed to have a plurality of serpentine liquid passageways for a coolant liquid that are parallel to the surface and in a density comparable to the heat density in the structure. The radiation to liquid component is positioned in contact with the structure surface and has a thickness so as to be conformable to the surface. In the component of the invention a pump capability is provided to provide and enhance liquid flow movement through the liquid passageways. The pump capability includes a branching of the passageways to at least one gear pump site. The pump capability provides pump enhanced flow movement to exhaust the liquid from the passageways to a heat exchange mechanism beyond the high density portions of the structure.

Referring to FIG. 1 a perspective depiction is provided of heat transfer from a high heat density radiating surface through a radiation to heat transfer component of the invention. In FIG. 1 a portion of the radiating surface 1 is shown of a high heat density high heat generating member 2 such as for example an integrated circuit where in a densely assembled layer depicted and labelled as element 3, there is an assembly of heat generating point sources that produce heat which is radiated through the surface 1.

In accordance with the invention a substantial increase in efficiency is achieved in carrying away heat radiated through the surface 1 by providing the radiation to heat transfer component 4 of the invention. The component 4 has essentially parallel surfaces 5 and 6 separated by a distance 7 sufficient to accommodate a closed loop liquid pathway capability with entrance and exit ports 8 and 9. A liquid pump capability is provided that is made up of a pump site 10 in which a gear pump member 11 rotated by a shaft 12 through a portion of the component 4 beyond the radiating face 3 so that liquid can be moved through passageway branches 13 and 14 in ensuring even cooling. Alternatively, the gear pump 11 can be driven by a magnetic coupling.

Referring to FIGS. 1, 2, and 3 together, the liquid pathways 20–23 in FIG. 2, are generally arranged to cover the area of the layer 3 and are illustrated as a closed loop of four serpentine pathways 20–23 with gear pump 11 moving the liquid in the component 4 at entering at port 8, passing through pathways 22 and 23 in parallel and further passing through branch 13, gear pump 11 in pump site 10, through branch 14, pathways 20 and 21 in parallel, to exhaust out port 9. A more detailed view of the serpentine nature of the pathways 20–23 may be seen in connection with FIG. 3 which is an expanded view taken along the lines 3—3 of FIG. 2. In FIG. 3 the coolant liquid enters pathway 28 at port 8 and progresses in a serpentine fashion toward branch 13 which is, beyond the FIG. 3 scale, so as to bring the liquid coolant to as much of the surface radiating the heat as practical. The pump and branches are designed and positioned so that a uniform flow is achieved and that any hot spots from locallized high heat density can be accommodated. There are a wide variety of pump sizes in the art and it will be apparent that with smaller pumps the pump site can be positioned over the layer 3 if desired.

Referring next to FIG. 4 where there is shown an exemplary perspective view of an overall increment of an apparatus with a cooling system employing the invention wherein the two surfaces 5 and 6 of the radiation to liquid heat transfer component 4 of the invention is positioned between integrated circuit arrays 30 and 31.

The ports 8 and 9 of the component 4 of the invention are connected to a liquid to gas medium, (air), heat transfer element heat exchanger 32 shown dotted in housing 33, by a means such as hoses that would not be visible in this perspective view. The liquid to air heat exchanger 32 is a standard in the art radiator type structure that is normally placed essentially perpendicular to the component 4 in an overall apparatus housing, only a portion of which, plate 34 being shown to permit viewing of the other components in this view, so that a gaseous medium such as air can be caused to flow in a closed loop depicted by arrow 35 and fan 36, in, and arrow 37 and fan 38, out, with the air in that closed loop flowing over the component 4 surfaces 5 and 6 and the surfaces of other components of the overall apparatus, such as other electronic cards 39 and 40, and exhausting at arrow 37 to the ambient.

The coolant liquid medium in the liquid closed heat exchange loop made up of the serpentine passageways 20–23 of the radiation to liquid heat transfer component 4 and the liquid to gas heat exchanger element 32 is propelled by the gear pump and branches 13 and 14 capability built into the radiation to liquid heat transfer component 4. The pump 11 and the shaft 12 of FIG. 1 may be housed in elements 41 and 42 the housings of which also may serve in a supporting role for the integrated circuit arrays 30 and 31.

The invention in the example thermal conversion unit of FIG. 4 provides two system heat conversion in which in a first system wherein high density heat at a planar surface is transferred into a liquid cooling closed loop in a planar radiated heat to liquid heat transfer component that is connected to a liquid to gas heat exchanger and in a second system a gas loop is arranged to carry away all radiated heat from the assembly and that in the liquid to gas heat exchanger and exhaust it to the ambient. The thermodynamics of the individual systems are somewhat independent and wide variations in structure are available in practising the invention. The planar radiated heat to liquid heat transfer component of the invention provides a transition in heat dissipation to heat transfer problems where the heat originates from a planar layer of high density point heat sources such as may be encountered in the integrated circuit field where the well known in the art Moore's rule would indicate a doubling of heat point source density every two years. The planar to radiated heat transfer component of the invention provides a transition in manufacturing to heat transfer, that is practiced employing the planar type tools such as photo and X-ray sensitive patterning, chemical vapor depositioning and precision ablation such as reactive ion etching and sputtering that usually can neither be practiced manually or observed without substantial magnification.

Figure 5:
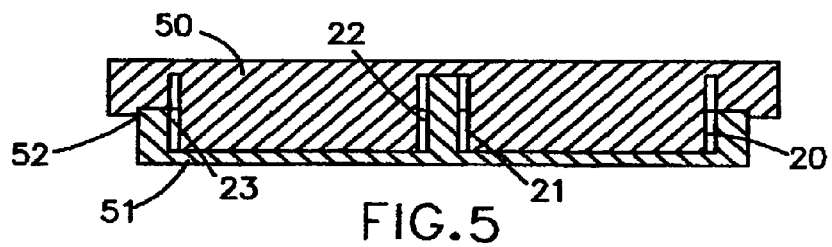
FIG. 5 is a cross sectional view of an exemplary radiation to liquid heat transfer component of the invention.
Figure 6:
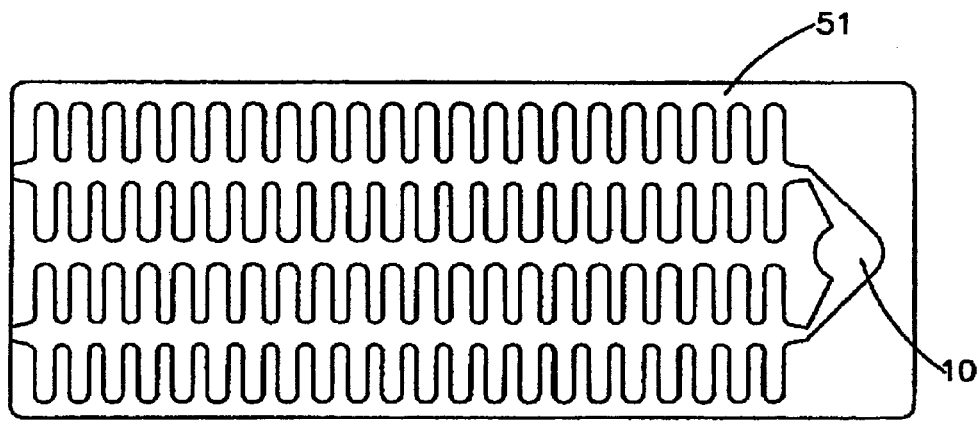
Figure 7:
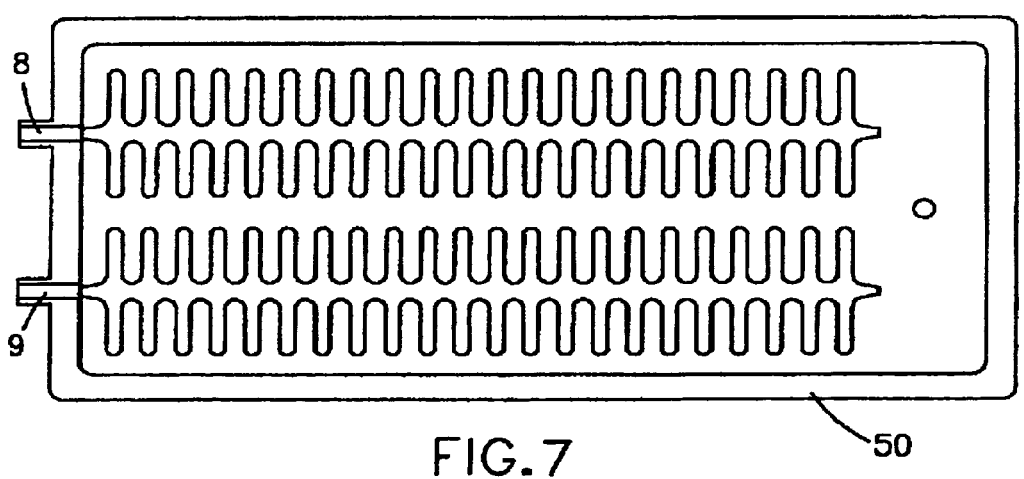

In manufacturing, in connection with FIGS. 5, 6 and 7, a planar fabrication technique is provided for the planar radiated heat to liquid heat transfer component of the invention.

Referring to FIG. 5, the component 4 is made up of a top part 50 and bottom part 51 that register in location with respect to each other by a means such as insertion fitting as illustrated at 52. The top and bottom shapes 50 and 51 respectively are processed to provide interdigitating shapes that produce serpentine pathways as illustrated in FIG. 2, and along the cross section as illustrated along the line 6—6 of FIGS. 6 and 7 together, a cross section of the pathways 20–23 is illustrated. In general in the planar type of processing the horizontal dimensions are arrived at by lithography whereas the vertical dimensions are arrived at by deposition or erosion. The two parts 50 and 51 of FIGS. 6 and 7 may be metal or plastic and may be machined, cast or molded and pressed together by bonding whereby the parts 50 and 51 interdigitate leaving the dimensional precision of the interdigitating parts providing the pathways desired.

In general heat transfer is enhanced where there is frequent impinging of the coolant liquid in the passageway sides and there is turbulent flow from frequent change of direction. Parallel serpentine channels is very effective. Further the number of channels 20–23 will be determined in accordance with standard physics relationships and are related to the pressure drop of the coolant liquid with the more channels the lower the pressure drop. Exceptions are encountered where it becomes necessary to provide special branches from the channels to pump sites to accommodate locallized hot spots. In addition to shaft driven pump impellers magnetically driven impellers are appearing in the art.

What has been described is two system heat conversion in an apparatus in which heat produced in a high density of point sources adjacent to a surface is provided with a radiation to liquid interface as a component in a first system and a second system transfers the radiated heat of the apparatus together with the heat extracted through the interface component to an ambient outside the apparatus.

What is claimed is:

1. A structure for the dissipation of heat radiating through a surface area of a component of said structure, the improvement comprising:

a planar shaped radiation to liquid heat transfer member positioned in contact with said surface area of said component;

said member being in contact with said surface area and having at least one serpentine shaped passageway, said serpentine passageway being a plurality of said passageways resulting from top and bottom plates each with protruding interdigitating pathway configurations; and wherein said member includes an embedded pump joining four serpentine passageways at a pump site;

said planar shaped transfer member having a heat receiving liquid, and, a second heat transfer capability operable to transfer heat in said first heat transfer member to a gaseous medium.

* * * * *